United States Patent [19]
D'Ambrisi

[11] Patent Number: 4,853,095
[45] Date of Patent: Aug. 1, 1989

[54] CONVERSION OF MANGANESE DIOXIDE TO PERMANGANATE

[75] Inventor: Joseph J. D'Ambrisi, Trumbull, Conn.

[73] Assignee: MacDermid, Incorporated, Waterbury, Conn.

[21] Appl. No.: 165,752

[22] Filed: Mar. 9, 1988

[51] Int. Cl.$^4$ ............................................. C25B 1/28
[52] U.S. Cl. ...................................... 204/82; 204/86; 252/79.1
[58] Field of Search .................................. 204/82, 86

[56] References Cited

U.S. PATENT DOCUMENTS

| | | | |
|---|---|---|---|
| 3,293,160 | 12/1966 | Mazzuchelli et al. | 204/82 |
| 3,986,941 | 10/1976 | Okabe et al. | 204/82 |
| 4,102,982 | 7/1978 | Weir, Jr. | 423/242 |
| 4,117,080 | 9/1978 | Kawasaki et al. | 423/235 |
| 4,592,852 | 6/1986 | Courduvelis | 252/79.1 |

OTHER PUBLICATIONS

Innes et al., Plating and Surface Finishing, Nov. 1978, pp. 36–40.

Primary Examiner—John F. Niebling
Assistant Examiner—David G. Ryser
Attorney, Agent, or Firm—St. Onge Steward Johnston & Reens

[57] ABSTRACT

A process is described for the electrolytic oxidation of manganese dioxide to an alkali metal permanganate by carrying out the electrolysis in dilute alkali metal hydroxide solution using a non-sacrificial anode and a cathode comprising an alkali-resistant electrode immersed in concentrated alkali metal hydroxide solution in a porous container. The process is particularly adapted to the regeneration of alkali metal permanganate from manganese dioxide which has been precipitated during use of a permanganate bath as an etchant in the fabrication of printed circuit boards and like purposes.

18 Claims, 1 Drawing Sheet

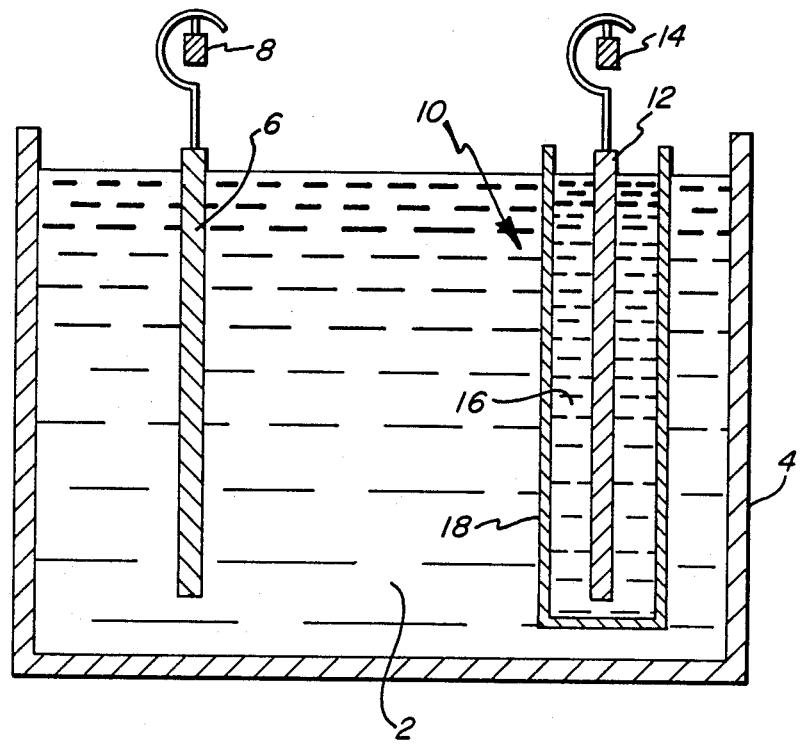

CONVERSION OF MANGANESE DIOXIDE TO PERMANGANATE

BACKGROUND OF THE INVENTION

1. Field of the Invention

This invention relates to the conversion of manganese dioxide to alkali metal permanganate and is more particularly concerned with the electrolytic oxidation of manganese dioxide to an alkali metal permanganate and the regeneration of permanganate etchant baths.

2. Description of the Prior Art

Commercial processes for the production of potassium permanganate have included the production of potassium permanganate by oxidative roasting of potassium hydroxide and manganese dioxide to form potassium manganate followed by oxidation of the latter using chemical oxidants such as chlorine or by electrolytic means.

Kawasaki et al U.S. Pat. No. 4,117,080 teach the oxidation of manganese dioxide to alkali metal manganate and/or permanganate by oxidation of manganese dioxide dispersed in strong alkali metal hydroxide solution using nitrous oxides as oxidizing agent in the presence of a trace of manganate or permanganate.

Okabe et al U.S. Pat. No. 3,986,941 describe the preparation of alkali metal permanganate in high purity by electrolytic oxidation of a slurry of manganese dioxide or alkali metal manganate in caustic alkali having a concentration in the range of 10 to 25 percent by weight at temperatures higher than about 60° C. These conditions (alkali concentration and temperature) are stated to be critical to successful operation of the process.

A particular need to convert manganese dioxide to alkali metal permanganate exists in the case of the regeneration of etchant solutions used in the treatment of plastics such as those used as substrates in the fabrication of printed circuit boards. Printed circuit boards vary in design but generally have a layer of copper laminated or otherwise held on either side of a plastic board, e.g. an epoxy resin board. In some cases the boards have multiple layers of copper separated from each other by epoxy and like plastic layers. In order to facilitate electrical connections between the circuits which are to be produced in the ultimate circuit boards, holes are drilled through the boards in appropriate locations and are subsequently plated with copper and the like to provide the necessary electrical connections. However, the formation of the through holes presents a plating problem in that the epoxy or other resin of the substrate is smeared on exposed copper during the drilling operation usually due to partial melting of resin by heat generated by the drilling.

Hence, prior to plating of the throughholes, the exposed resin in and around the holes is generally treated with a plastic etchant to improve adhesion of metal plating to the plastic. The most commonly employed etchant solution is an alkaline bath containing alkali metal permanganate as oxidizing agent. As the bath is used in the etching operation over a period of time a precipitate of manganese dioxide gradually accumulates as the by-product of the decomposition of the permanganate and as a by-product of epoxy resin etching. Eventually the etchant power of the bath falls to an unsatisfactory level and the bath can no longer be used.

Various attempts have been made to regenerate the bath and/or to improve its performance. A summary of such attempts is given in Courduvelis et al U.S. Pat. No. 4,592,852 which describes a method of improving permanganate etchant baths and prolonging their operating life by incorporating into the bath an effective amount of a secondary oxidant capable of oxidizing manganate ions to permanganate ions.

It has not previously been suggested that a permanganate etchant bath containing precipitated manganese dioxide could be regenerated electrolytically in situ to convert the manganese dioxide to alkali metal manganate and permanganate. The electrolytic regeneration of other etchants, namely, chromic acid baths employed to etch plastic materials such as ABS, has been described by Innes et al., Plating and Surface Finishing, November 1978, pp 36–40. In the process there described the chromous ($Cr^{+3}$) salts produced in the bath in the oxidative etchant process are reconverted to chromic oxide by electrolysis of the strongly acid solution using a metal tin-lead anode and a cathode comprising a metal (copper) electrode immersed in 4.6N sulfuric acid solution contained in a porous ceramic container.

SUMMARY OF THE INVENTION

It is an object of the invention to provide a novel process for the electrolytic oxidation of manganese dioxide to an alkali metal permanganate.

It is a further object of the invention to provide a method of regenerating in situ an etchant alkaline bath comprising alkali metal permanganate and precipitated manganese dioxide.

It is yet another object of the invention to convert manganese dioxide present in an alkaline permanganate etchant bath to alkali metal permanganate by electrolytic oxidation.

These objects, and other objects which will become apparent from the description which follows, are achieved by the process of the present invention. The latter, in its broadest aspect, comprises an improved process for generating alkali metal permanganate by electrolytic oxidation of manganese dioxide in the presence of an aqueous solution of alkali metal hydroxide wherein the improvement comprises employing a non-sacrificial anode and a cathode which comprises an alkali-resistant electrode immersed in a concentrated aqueous solution of an alkali metal hydroxide in a porous container.

In a particular embodiment, the process of the invention is employed to regenerate an alkali permanganate etchant bath by converting the manganese dioxide precipitate in said bath to alkali permanganate in situ, i.e. by introducing the above type anode and cathode into the etchant bath and carrying out the electrolytic oxidation in the actual etchant bath without removal of the contents thereof or any pretreatment of said bath. The advantages which flow from the ability to regenerate the etchant bath in situ in this manner will be readily apparent to one skilled in the art.

BRIEF DESCRIPTION OF THE DRAWINGS

The FIGURE is a cross-sectional, partly schematic representation illustrating an electrolytic cell for carrying out the process of the invention.

DETAILED DESCRIPTION OF THE INVENTION

In carrying the process of the invention in its broadest aspect, namely the conversion of manganese dioxide to an alkali metal permanganate, the manganese dioxide is dispersed in an aqueous solution of an alkali metal hydroxide, the alkali metal ion of which may or may not correspond to the alkali metal ion in the permanganate salt to be generated. The alkali metal hydroxide solution is advantageously of a concentration corresponding to about 0.1N to about 3.0N and preferably from about 0.5N to about 1.5N. The amount of manganese dioxide present in the dispersion is advantageously not greater than about 200 grams per liter and preferably in the range of about 10 to about 50 grams per liter. The upper limit of amount of manganese dioxide present in any given instance is governed by the solubility of the resulting permanganate in aqueous solution at the temperature employed in the process of the invention. Illustratively 1 part by weight of potassium permanganate is soluble in 14.2 parts by weight of water at circa 25° C., but is soluble in only 3.5 parts of water at the boiling point. Sodium permanganate has much greater solubility in both cold and hot water.

The manganese dioxide and the solution of alkali metal hydroxide are placed in a suitable vessel which is preferably provided with agitation means such as a stirrer or stirrers for maintaining the manganese dioxide dispersed substantially homogeneously in the alkali metal hydroxide solution. Advantageously the manganese dioxide is, or has been comminuted to, a particle size of the order of about 100 microns or less. The electrolytic oxidation of the manganese dioxide is carried out using any type of non-sacrificial anode conventionally employed in the art but employing a particular type of cathode the nature of which is the key to the success of the process of the invention. Thus the anode can be fabricated of carbon, and metals such as aluminum, titanium and the like coated with rare earth oxides.

The cathode comprises an electrode which is resistant to attack by alkali metal hydroxide and which is immersed in a concentrated aqueous solution of alkali metal hydroxide contained in a vessel which will permit passage of ions through the walls thereof. Illustrative of the alkali resistant material from which the electrode is fabricated are stainless steel, carbon, aluminum, titanium and the like coated with rare earth oxides. The alkali metal hydroxide solution employed in the cathode advantageously has a concentration of alkali metal hydroxide of about 10N to about 25N and preferably from about 18N to about 20N. The vessel in which the electrode and concentrated alkali metal hydroxide are housed is fabricated advantageously from porous ceramic, sintered glass, and the like. The actual shape and dimensions of the container are not critical.

DETAILED DESCRIPTION OF THE DRAWINGS

A typical example of an electrolytic cell for use in carrying out the process in accordance with the invention is shown in cross-sectional schematic form in FIG. 1. Cell 4 contains the dispersion 2 of particulate manganese dioxide in aqueous alkali metal hydroxide solution having a concentration within the limits set forth above. Anode 6 is typically a carbon electrode and is connected to and suspended from anode bus bar 8. The cathode, shown generally as 10, comprises an electrode 12, typically of stainless steel, connected to and suspended from cathode bus bar 14. The electrode 12 is suspended in a 50 percent by weight aqueous solution 16 of alkali metal hydroxide which is contained in cylindrical pot 18. The latter is fabricated from porous ceramic which permits passage of ions through the wall thereof. A typical porous ceramic pot is available commercially from Ferro Corp., Cleveland, Ohio.

Advantageously the same alkali metal hydroxide (but in different concentrations) is employed in the suspension 2 and the cathode solution 16. In a preferred embodiment the alkali metal hydroxide in both solutions is sodium hydroxide. The electrolytic oxidation of the dispersion 2 of manganese dioxide is carried out advantageously using a current concentration of about 10 to about 100 amps/liter. However, this range is offered for purposes of illustration and is not to be construed as limiting. In general the higher the current concentration the shorter the time required for regeneration of the permanganate. The electrolytic conditions employed in any given instance may vary depending upon factors such as the amount of manganese dioxide in the dispersion, the concentration of alkali metal hydroxide in the solution and the like. One condition which influences the rate at which the oxidation takes place is the temperature of the dispersion 2. In general it is found that, using a current concentration in the lower end of the above range, the desired oxidation proceeds at a rate which may be too slow to be of practical commercial value if the dispersion is maintained at ambient temperature. Advantageously, depending upon the current concentration employed, the temperature of the dispersion is maintained in the region of about 50° C. to about 80° C. and preferably of the order of about 65° C. to about 75° C. during the electrolytic operation. However, temperatures above or below these ranges can be employed if desired. The upper limit of temperature is restricted only by the boiling point of the dispersion.

The addition of a catalytic amount of an oxidizing agent such as an alkali permanganate to the dispersion 2 greatly facilitates the efficiency of operation at the beginning of the electrolytic oxidation.

The electrolytic oxidation is continued until substantially all the manganese dioxide has been converted to alkali metal permanganate. The end point can be detected by routine analytical procedures such as titration of aliquots to determine the concentration of permanganate therein. Visual observation of an aliquot will also indicate disappearance of manganese dioxide. If desired, the permanganate can be isolated from the resulting solution by conventional means such as crystallization. The permanganate may be contaminated with small amounts of the corresponding manganate (hexavalent Mn) which is an intermediate in the production of the permanganate. The permanganate can be purified by recrystallization or like conventional techniques.

The process of the invention has been described above in its broadest aspect namely in relation to the electrolytic oxidation of manganese dioxide to an alkali permanganate regardless of the source of the manganese dioxide employed. However, in a particular and preferred embodiment the process of the invention is utilized to regenerate permanganate etchant baths which have reached the end of their useful life and which contain precipitated manganese dioxide as a by-product. Such baths, when initially prepared, generally comprise an alkali metal permanganate, present in amount close to the limit of its solubility, in an aqueous solution of alkali metal hydroxide present in an amount in the range of about 2.5 to about 5 percent by weight. There may also be present various additives such as surface active agents. As the etchant bath is employed to etch plastic and like materials in the manner hereinabove described the level of permanganate slowly diminishes and by-product manganese dioxide separates. Eventually the bath fails to give satisfactory performance and is replaced by a newly prepared bath.

It has now been found, surprisingly and unexpectedly, that, at the end of its useful working life, a permanganate etchant bath can be regenerated by use of the process of the invention. Further it is unnecessary to remove the bath contents from the vessel in which the bath is present. It is merely required that the appropriate anode and cathode, as set forth above, be introduced into the bath and connected to an appropriate source of DC current. The electrolytic oxidation is then carried out using all the conditions of temperature, current density and the like discussed above in regard to the broader aspect of the invention and the process is continued until all or any desired proportion of the manganese dioxide present in the bath has been converted to permanganate. No prior treatment of the contents of the exhausted bath is necessary before carrying out the regeneration of the bath. At the end of the regeneration process the electrodes and auxiliary equipment are removed and the bath is again ready for its appointed use. Thus, in contrast to the clear teachings of Okabe et al, supra, it is unnecessary to add sufficient alkali metal hydroxide to the bath itself to bring the concentration of the latter up to a minimum of 10 percent by weight. Not only would such an addition add greatly to the cost of regeneration, but the resulting solution, even after regeneration, would be unusable as an etchant by reason of the high level of alkali metal hydroxide therein.

Accordingly it is believed that the process of the invention not only represents a significant improvement in the production of alkali metal permanganate from manganese dioxide, but also represents a highly useful and novel method of regenerating a spent permanganate etchant bath.

The following example illustrates the process of the invention and the best mode known to the inventor of carrying out the same but is not to be construed as limiting.

EXAMPLE

A bath having the following composition was prepared.

| | |
|---|---|
| potassium permanganate | 28.7 g./liter |
| potassium manganate | 6.1 g./liter |
| sodium hydroxide | 40 g./liter |

To this solution was added 50 g./liter of powdered manganese dioxide which had been recovered from a commercial permanganate etchant bath. The resulting suspension was agitated using a mechanical stirrer, heated to a temperature of circa 63° C. and maintained thereat while the suspension was subjected to electrolytic oxidation using a carbon anode and a cathode consisting of a stainless steel electrode suspended in a 50 percent by weight aqueous solution of sodium hydroxide contained in a cylindrical porous ceramic pot. A DC current of 20 amps was employed with a current concentration of 10 amps/liter. The electrolysis was continued for 16 hours and 50 minutes. At the end of this time the bath was analyzed and found to have the following composition.

| | |
|---|---|
| potassium permanganate | 42.2 g./liter |
| potassium manganate | 15.9 g./liter |
| residual manganese dioxide | 34 g./liter |

It will be apparent from the above analysis that the permanganate content of the bath had increased by 27 g. (i.e. 13.5 g./liter) and the manganate content had increased by 19.6 g. (i.e. 9.8 g./liter) while the manganese dioxide had decreased by 32 g. (i.e. 16 g./liter).

What is claimed is:

1. In a process for generating alkali metal permanganate by electrolytic oxidation of manganese dioxide in the presence of an electrolyte comprising an aqueous solution of alkali metal hydroxide the improvement which comprises employing a non-sacrificial anode mounted in said electrolyte and a cathode which comprises an alkali resistant electrode immersed in a concentrated aqueous solution of an alkali metal hydroxide in a container porous to ions, said container being mounted in said electrolyte and serving as a diaphragm separating said anode and said cathode.

2. A process according to claim 1 wherein said anode is a carbon electrode.

3. A process according to claim 1 wherein said cathode is a stainless steel electrode immersed in concentrated aqueous alkali metal hydroxide solution in a porous ceramic pot.

4. A process according to claim 1 wherein the temperature of the aqueous alkali metal hydroxide solution in contact with the manganese dioxide is from about 50° C. to about 80° C.

5. A process according to claim 1 wherein the concentration of the alkali metal hydroxide in the solution in contact with the manganese dioxide is from about 0.1N to about 3N.

6. A process according to claim 1 wherein the concentration of the alkali metal hydroxide solution employed in said cathode is in the range of about 10N to about 25N.

7. A process according to claim 1 wherein the manganese dioxide is present in a bath containing alkali metal permanganate and alkali metal hydroxide from which the said dioxide has been precipitated during operation of said bath as an etchant in the manufacture of printed circuit boards.

8. A process according to claim 1 wherein the alkali metal hydroxide present in both the aqueous solution in contact with the manganese dioxide and the said cathode is sodium hydroxide.

9. A process according to claim 1 wherein the electrolytic oxidation employs a current concentration of about 10 to about 100 amps per liter.

10. A process for regenerating an aqueous etchant bath comprised of an alkali metal hydroxide and permanganate which has approached or reached inefficiency as to its useful operating life by virtue of diminished permanganate concentration in said bath and precipitation in said bath of manganese dioxode, comprising subjecting said bath to electrolytic oxidation using a non-sacrificial anode mounted in said bath and a cathode comprising an alkali-resistant electrode immersed in a concentrated aqueous solution of an alkali metal hydroxide in a container porous to ions, said container being mounted in said bath and serving as a diaphragm separating said anode and said cathode.

11. A process according to claim 10 wherein said anode is a carbon electrode.

12. A process according to claim 10 wherein said cathode is a stainless steel electrode immersed in concentrated aqueous alkali metal hydroxide solution in a porous ceramic pot.

13. A process according to claim 10 wherein the concentration of alkali metal hydroxide present in said bath is in the range of about 0.1N to about 3N.

14. A process according to claim 10 wherein the concentration of alkali metal hydroxide present in said cathode is in the range of about 10N to about 25N.

15. A process according to claim 10 wherein the temperature in said bath during said electrolytic oxidation is from about 50° C. to about 80° C.

16. A process according to claim 10 wherein the electrolytic oxidation employs a current concentration of about 10 to about 100 amps per liter.

17. The process according to claim 10 wherein said etchant bath further comprises manganate.

18. The process according to claim 10 wherein said bath is subjected to electrolytic oxidation without removal of said bath from the vessel in which it is contained.

* * * * *